United States Patent
Lee et al.

(10) Patent No.: US 10,770,674 B2
(45) Date of Patent: Sep. 8, 2020

(54) OLED LIGHTING APPARATUS

(71) Applicant: LG DISPLAY CO., LTD., Seoul (KR)

(72) Inventors: Kyu-Hwang Lee, Seoul (KR); Taejoon Song, Paju-si (KR); Chulho Kim, Incheon (KR); Hwankeon Lee, Daejeon (KR)

(73) Assignee: LG DISPLAY CO., LTD., Seoul (KR)

(*) Notice: Subject to any disclaimer, the term of this patent is extended or adjusted under 35 U.S.C. 154(b) by 16 days.

(21) Appl. No.: 16/197,301

(22) Filed: Nov. 20, 2018

(65) Prior Publication Data
US 2019/0165297 A1  May 30, 2019

(30) Foreign Application Priority Data
Nov. 28, 2017 (KR) .................. 10-2017-0159846

(51) Int. Cl.
*H01L 51/52* (2006.01)
*G09G 3/3225* (2016.01)
(Continued)

(52) U.S. Cl.
CPC ....... *H01L 51/5203* (2013.01); *G09G 3/3225* (2013.01); *H01L 27/3276* (2013.01);
(Continued)

(58) Field of Classification Search
CPC ............. H01L 51/5203; H01L 27/3276; H01L 51/5253; H01L 51/5237; H01L 2251/5361;
(Continued)

(56) References Cited

U.S. PATENT DOCUMENTS

2009/0121323 A1   5/2009   Kwon et al.
2013/0207094 A1   8/2013   Tchakarov
(Continued)

FOREIGN PATENT DOCUMENTS

CN   104393009 A    3/2015
JP   2013-251255 A  12/2013
(Continued)

OTHER PUBLICATIONS

Taiwanese Office Action dated Sep. 20, 2019 issued in a related Taiwanese Patent Application No. 107142445 (7 pages) and English language translation (5 pages).
(Continued)

*Primary Examiner* — Muhammad N Edun
(74) *Attorney, Agent, or Firm* — Polsinelli PC

(57) ABSTRACT

Disclosed herein is an OLED lighting apparatus which can achieve both improvement in reliability and reduction in manufacturing cost. In the OLED lighting apparatus, an encapsulation layer is disposed over the active area and the non-active area on a buffer layer, such that a pad disposed in the non-active area of the buffer layer can be stably secured by the encapsulation layer bonded thereto. Accordingly, upon tape automated bonding between an FPCB substrate with a COF tape attached thereto and a via electrode, the COF tape does not directly contact the pad but contacts the via electrode connected to the pad, particularly a connection terminal of the via electrode disposed on an upper surface of the encapsulation layer, thereby establishing electrical connection between the FPCB substrate and the via electrode. In this way, the connection terminal of the via electrode is electrically connected to the FPCB substrate via the COF tape, whereby a signal from the outside can be applied to the pad connected to the via electrode.

17 Claims, 6 Drawing Sheets

(51) Int. Cl.
*H01L 27/32* (2006.01)
*H01L 51/00* (2006.01)

(52) U.S. Cl.
CPC ...... *H01L 51/5212* (2013.01); *H01L 51/5237* (2013.01); *H01L 51/5253* (2013.01); *H01L 51/003* (2013.01); *H01L 2251/5338* (2013.01); *H01L 2251/5361* (2013.01)

(58) Field of Classification Search
CPC ........... H01L 51/003; H01L 2251/5338; H01L 51/5212; G09G 3/3225
See application file for complete search history.

(56) References Cited

U.S. PATENT DOCUMENTS

| | | |
|---|---|---|
| 2013/0240855 A1 | 9/2013 | Chida et al. |
| 2016/0062520 A1* | 3/2016 | Choi ................ G06F 3/0412 345/174 |
| 2016/0276630 A1 | 9/2016 | Farrnbacher et al. |
| 2017/0005155 A1* | 1/2017 | You ................ H01L 27/3258 |
| 2017/0125505 A1* | 5/2017 | Oh .................... H01L 51/52 |
| 2018/0061898 A1* | 3/2018 | Oh .................... H01L 27/322 |

FOREIGN PATENT DOCUMENTS

| | | |
|---|---|---|
| JP | 2015-005737 A | 1/2015 |
| JP | 2015-220090 A | 12/2015 |
| KR | 10-1372914 B1 | 3/2014 |
| KR | 10-2015-0063669 A | 6/2015 |
| KR | 10-2016-0083641 A | 7/2016 |
| TW | 201246528 A | 11/2012 |
| WO | 2014/188895 A1 | 11/2014 |

OTHER PUBLICATIONS

Japanese Office Action dated Oct. 15, 2019 issued in a related Japanese Patent Application No. 2018-218646 (11 pages).
European Search Report dated Mar. 29, 2019 issued in connection with the corresponding European patent application EP 18 20 7732.1. 9 pages.

* cited by examiner

OLED LIGHTING APPARATUS

CROSS-REFERENCE TO RELATED APPLICATION

This application claims the benefit of the Korean Patent Application No. 10-2017-0159846 filed on Nov. 28, 2017, which is hereby incorporated by reference in its entirety.

BACKGROUND

Field of the Disclosure

The present disclosure relates to a display device, and more particularly, to an organic light emitting diode (OLED) lighting apparatus. Although the present disclosure is suitable for a wide scope of applications, it is particularly suitable for improving reliability of the organic light emitting diode (OLED) lighting apparatus and reducing manufacturing costs.

Description of the Background

Currently, fluorescent lamps and incandescent lamps are mainly used as a lighting apparatus. The incandescent lamps have a problem of a very low energy efficiency, despite a high color rendering index, and the fluorescent lamps have a problem of a low color rendering index and contain mercury causing environmental pollution, despite a good energy efficiency.

Accordingly, light emitting diodes (LEDs) have been proposed as a lighting apparatus capable of replacing fluorescent lamps or incandescent lamps. Such a light emitting diode is formed of an inorganic luminescent material, and luminous efficacy thereof has a maximum value in the blue wavelength band and decreases toward the red wavelength band and the green wavelength band, which has the highest visibility. Accordingly, a method of obtaining white light by combining a red LED with a green LED and a blue LED has a problem of reduction in luminous efficacy. Such a method also has a problem of reduction in color rendering properties due to a small width of an emission peak of each LED.

In order to overcome such problems, there has been proposed a lighting apparatus configured to emit white light through combination of a blue LED with yellow phosphors instead of combining a red LED with a green LED and a blue LED. This is because a method of obtaining white light through combination of a blue LED having high luminous efficacy with phosphors that emit yellow light when irradiated with blue light from the blue LED is more efficient than use of a green LED, which has low luminous efficacy.

However, such a lighting apparatus configured to emit white light through combination of the blue LED with the yellow phosphors has limited luminous efficacy due to low luminous efficacy of the yellow phosphors.

In order to solve such a problem of reduction in luminous efficiency, there has been proposed an OLED lighting apparatus using an organic light emitting device formed of an organic luminescent material. Generally, an organic light emitting device has relatively good luminous efficacy in the green and red wavelength regions, as compared with an inorganic light emitting device. In addition, such an organic light emitting device exhibits improved color rendering properties due to relatively wide emission peak in the blue, red, and green wavelength regions, as compared with an inorganic light emitting device, and thus can emit light similar to sunlight.

SUMMARY

An aspect of the present disclosure is aimed at providing an OLED lighting apparatus which can achieve both improvements in reliability and reduction in manufacturing costs.

For this purpose, an OLED lighting apparatus according to the present disclosure omits a substrate and instead has an encapsulation layer disposed over an active area and a non-active area on a buffer layer.

Thus, the OLED lighting apparatus according to the aspect of the present disclosure includes a via electrode passing through the encapsulation layer to be connected to a pad, thereby improving reliability of an organic light emitting device while achieving reduction in manufacturing costs.

In accordance with aspects of the present disclosure, an OLED lighting apparatus includes an encapsulation layer disposed over an active area and a non-active area on a buffer layer to cover a second electrode and a pad.

In addition, the OLED lighting apparatus includes a via electrode passing through the encapsulation layer in the non-active area to be connected to the pad.

The via electrode may include: a penetration portion passing through the encapsulation layer, the pad, and the buffer layer in the non-active area to be connected to the pad; and a connection terminal disposed on an upper surface of the encapsulation layer in the non-active area to be connected to the penetration portion.

In the OLED lighting apparatus according to the aspects, since the encapsulation layer is disposed over the active area and the non-active area on the buffer layer, the pad disposed in the non-active area of the buffer layer can be stably secured by the encapsulation layer bonded thereto.

Accordingly, in the OLED lighting apparatus according to the aspects, upon tape automated bonding between an Flexible Printed Circuit Board (FPCB) substrate with a Chip on Film (COF) tape attached thereto and the via electrode, the COF tape does not directly contact the pad but contacts the via electrode connected to the pad, particularly the connection terminal of the via electrode disposed on the upper surface of the encapsulation layer, thereby establishing electrical connection between the FPCB substrate and the via electrode.

As a result, in the OLED lighting apparatus according to the aspects, the connection terminal of the via electrode is electrically connected to the FPCB substrate via the COF tape, such that a signal from the outside can be applied to the pad connected to the via electrode.

As such, according to the present disclosure, the OLED lighting apparatus includes the encapsulation layer disposed over the active area and the non-active area on the buffer layer, such that the pad disposed in the non-active area of the buffer layer can be stably secured by the encapsulation layer bonded thereto.

In addition, upon tape automated bonding between an FPCB substrate with a COF tape attached and a via electrode, the COF tape does not directly contact the pad but contacts the via electrode connected to the pad, particularly a connection terminal of the via electrode disposed on the upper surface of the encapsulation layer, thereby establishing electrical connection between the FPCB substrate and the via electrode.

In this way, the connection terminal of the via electrode is electrically connected to the FPCB substrate via the COF tape, whereby a signal from the outside can be applied to the pad connected to the via electrode.

Further, in the OLED lighting apparatus according to the aspect of the present disclosure, since tape automated bonding is performed after the pad disposed in the non-active area of the buffer layer is stably secured by the encapsulation layer, it is possible to omit a substrate formed of a transparent PI film, which would otherwise be disposed under the buffer layer, thereby reducing manufacturing costs.

Furthermore, since the OLED lighting apparatus according to the present disclosure does not require such a substrate, a method of forming auxiliary wires, an organic light emitting device and the like can be executed at a high temperature exceeding 350° C., thereby improving reliability of the organic light emitting device.

Furthermore, in the OLED lighting apparatus according to the present disclosure, the buffer layer formed as an inorganic layer such as $SiO_x$ or $SiN_x$ is also exposed to the high temperature process exceeding 350° C. and thus can have improved properties in terms of strength and hardness.

In another aspect, an OLED lighting apparatus having an active area and a non-active area includes a buffer layer; an encapsulation layer disposed over the buffer layer; a pad connected to a first electrode and a second electrode of an organic light emitting device and disposed in the non-active area; and a connection terminal disposed on an upper surface of the encapsulation layer in the non-active area, wherein the pad is connected to the connection terminal.

In another aspect, an OLED lighting apparatus having an active area and a non-active area includes a buffer layer; an auxiliary wire disposed on the buffer layer; an organic light emitting device comprising a first electrode disposed on the auxiliary wire to be connected to the auxiliary wire and an organic light emitting layer and a second electrode stacked on the first electrode; an encapsulation layer disposed over the buffer layer and having an opening.

BRIEF DESCRIPTION OF THE DRAWINGS

The above and other aspects, features and advantages of the present disclosure will become apparent from the following description of aspects given in conjunction with the accompanying drawings.

DETAILED DESCRIPTION

Figure 1:
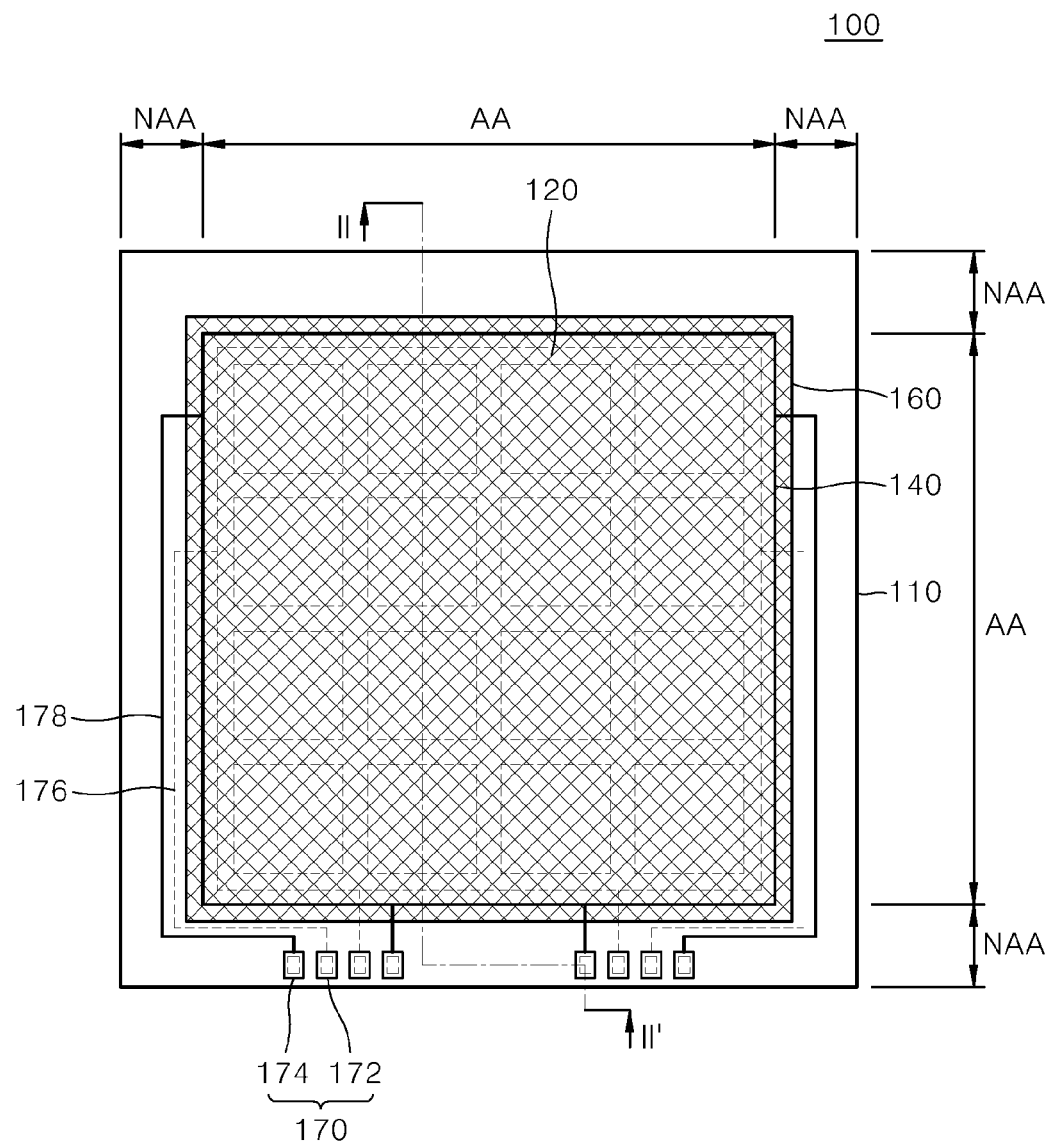
FIG. 1 is a plan view of an OLED lighting apparatus according to a first aspect of the present disclosure.

Hereinafter, aspects of the present disclosure will be described in detail with reference to the accompanying drawings. It should be understood that the present disclosure is not limited to the following aspects and may be embodied in different ways, and that the aspects are given to provide complete disclosure of the present disclosure and to provide thorough understanding of the present disclosure to those skilled in the art. Description of known functions and constructions which can unnecessarily obscure the subject matter of the present disclosure will be omitted. Like components will be denoted by like reference numerals throughout the specification.

Now, an OLED lighting apparatus according to a first aspect of the present disclosure will be described in detail with reference to the accompanying drawings. FIG. 1 is a plan view of an OLED lighting apparatus according to a first aspect of the present disclosure and FIG. 2 is a cross-sectional view taken along line II-II' of FIG. 1.

Figure 2:
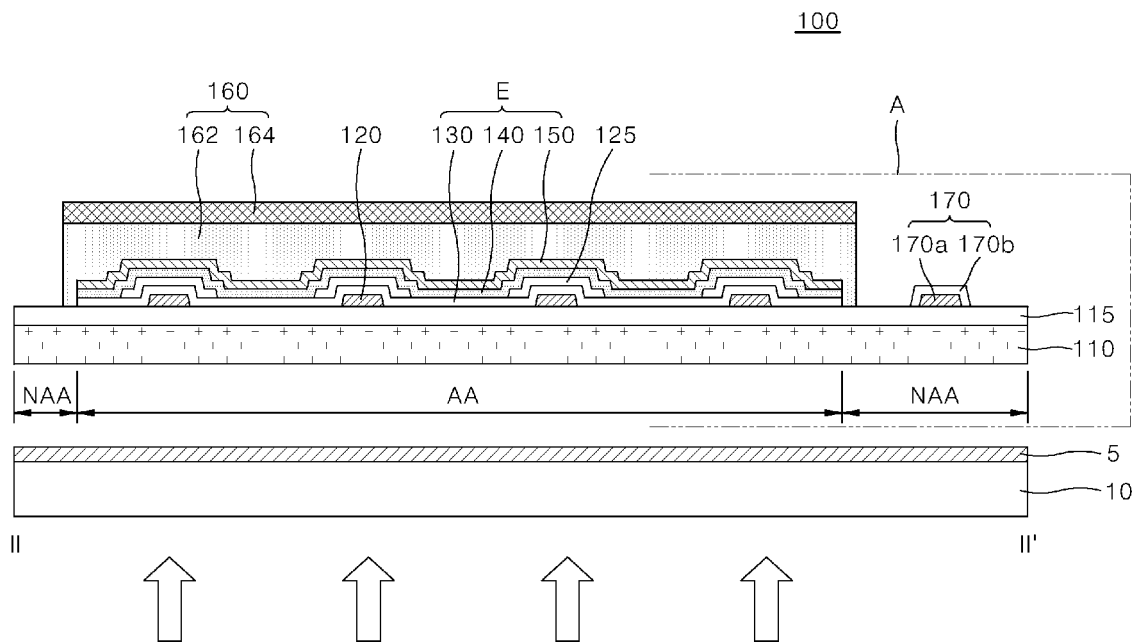
FIG. 2 is a cross-sectional view taken along line II-II' of FIG. 1.

Referring to FIG. 1 and FIG. 2, an OLED lighting apparatus 100 according to a first aspect includes a buffer layer 115 disposed on a substrate 110 and an organic light emitting device E disposed on the buffer layer 115.

The organic light emitting device E includes a first electrode 130 disposed on the buffer layer 115, an organic light emitting layer 140 disposed on the first electrode 130, and a second electrode 150 disposed on the organic light emitting layer 140. In the OLED lighting apparatus 100 having such a structure, the organic light emitting layer 140 emits light when a signal is applied to the first electrode 130 and the second electrode 150 of the organic light emitting device E, whereby light emission over the entire substrate 110 can be achieved.

Here, auxiliary wires 120 are arranged in matrix form on the substrate 110. The auxiliary wires 120 are formed of metal having high electrical conductivity to allow uniform voltage to be applied to the first electrode 130 disposed over the entire area of the substrate 110, whereby the OLED lighting apparatus 100 can emit light with uniform luminance even when implemented as a large lighting apparatus. The auxiliary wires 120 may be disposed between the buffer layer 115 and the first electrode 130 to directly contact the first electrode 130.

The first electrode 130 is formed of a transparent conductive material, such as ITO, and advantageously transmits emitted light therethrough. However, the first electrode 130 has a drawback of much higher electrical resistance than metals. As a result, when the OLED lighting apparatus 100 is implemented as a large lighting apparatus, current spreading in a wide active area AA may not be uniform due to high resistance of the transparent conductive material. Such non-uniform current spreading makes it difficult for the large OLED lighting apparatus 100 to emit light with uniform luminance.

The auxiliary wires 120 may be arranged in the form of a matrix, mesh, hexagon, octagon, or circle having a small linewidth over the entire substrate 110 to allow uniform voltage to be applied to the first electrode 130 on the entire substrate 110, such that the large area OLED lighting device 100 can emit light with uniform luminance.

Although the auxiliary wires 120 are shown as disposed beneath a lower surface of the first electrode 130, the present disclosure may not be limited thereto and the auxiliary wires 120 may be disposed on an upper surface of the first electrode 130. The auxiliary wires 120 may be formed of any one of Al, Au, Cu, Ti, W, Mo, Cr, and alloys thereof. The auxiliary wires 120 may have a monolayer structure or a multilayer structure.

The substrate 110 may be divided into a plurality of unit pixels by the auxiliary wires 120 arranged in matrix form. Since the auxiliary wires 120 have much lower resistance than the first electrode 130, voltage for the first electrode 130 is applied to the first electrode 130 through the auxiliary wires 120 rather than being directly applied to the first electrode 130 via a first pad 172. In this way, the first electrode 130 formed over the entire substrate 110 can be divided into the plurality of pixels by the auxiliary wires 120.

Although the linewidth of the auxiliary wires can vary depending on the kind of metal used as a material for the auxiliary wires, the area of the OLED lighting apparatus 100, the size of the pixel, and the like, the auxiliary wires 120 may have a linewidth of about 30 μm to about 70 μm.

In addition, the substrate 110 is provided thereon with a pad 170 that is connected to both the first electrode 130 and the second electrode 150 and receives voltage from the outside. For this purpose, the pad 170 may include a first pad 172 connected to the first electrode 130 and a second pad 174 connected to the second electrode 150. The first pad 172 and the second pad 174 may be electrically connected to the first electrode 130 and the second electrode 150 through a first connection wire 176 and the second connection wire 178, respectively.

Although the pad 170 is shown as disposed at one side of the substrate 110 in FIG. 1, the present disclosure may not be limited thereto and the location and number of the pad 170 may be varied. For example, the pad 170 may be disposed at two opposite sides of the substrate 110 or at four sides of the substrate 110. For example, the first pad 172 and the second pad 174 may be disposed at two opposite sides of the substrate 110 or at four sides of the substrate 110.

Here, the pad 170 may include a pad electrode 170a disposed on the same layer as the auxiliary wires 120 and formed of the same material as the auxiliary wires 120 and a pad electrode terminal 170b disposed on the pad electrode 170a and formed of the same material as the first electrode 130.

A protective layer 125 is disposed on the first electrode 130. Specifically, the protective layer 125 is disposed on the first electrode 130 to cover the auxiliary wires 120.

Since the auxiliary wires 120 are formed of an opaque metal, light is not emitted from regions in which the auxiliary wires 120 are formed. Accordingly, the protective layer 125 is disposed only on portions of an upper surface of the first electrode 130, under which the auxiliary wires 120 are disposed, whereby light can be emitted only from light emitting regions of the pixels.

In an aspect, the protective layer 125 may be disposed between the first electrode 130 and the organic light emitting layer 140 to cover the auxiliary wire 120.

In addition, the protective layer 125 may be formed to cover the auxiliary wires 120 to reduce step coverage caused by the auxiliary wires 120 such that the organic light emitting layer 140 and the second electrode 150 can be subsequently stacked in a stable manner without disconnection.

For this purpose, the protective layer 125 may be formed of an inorganic material, such as $SiO_x$ and $SiN_x$. Alternatively, the protective layer 125 may be formed of an organic material, such as photoacryl, or may be formed as a plurality of layers including an inorganic layer and an organic layer.

The organic light emitting layer 140 and the second electrode 150 are sequentially disposed on the first electrode 130 and the protective layer 125.

The organic light emitting layer 140 may be formed of an organic luminescent material that emits white light. For example, the organic light emitting layer 140 may include a blue organic light emitting layer, a red organic light emitting layer, and a green organic light emitting layer. Alternatively, the organic light emitting layer 140 may have a tandem structure including a blue light emitting layer and a yellow-green light emitting layer. However, it should be understood that the present disclosure is not limited thereto and the organic light emitting layer 140 may be configured in various ways.

Although not shown in the drawings, the organic light emitting device E may further include: an electron injection layer and a hole injection layer which inject electrons and holes into the organic light emitting layer 140, respectively; an electron transport layer and a hole transport layer which transport injected electrons and holes to the organic light emitting layer; and a charge generation layer which generates charges such as electrons and holes.

The organic light emitting layer 140 may be formed of a material that receives holes and electrons from the hole transport layer and the electron transport layer, respectively, to emit light in the visible region through recombination of the holes and the electrons. Particularly, a material having good quantum efficiency for fluorescence or phosphorescence may be used. Examples of the material may include an 8-hydroxyquinoline aluminum complex ($Alq_3$), a carbazole compound, a dimerized styryl compound, BAlq, a 10-hydroxybenzoquinoline-metal compound, benzoxazole, benzthiazole, and benzimidazole compounds, and poly(p-phenylene vinylene) (PPV), without being limited thereto.

The second electrode 150 may be formed of a metal, such as Ca, Ba, Mg, Al, and Ag, or alloys thereof. Here, the substrate 110 is provided in a non-active region NAA thereof with the second pad 174 that is connected to the second electrode 150 to apply voltage to the second electrode 150.

Figure 3:
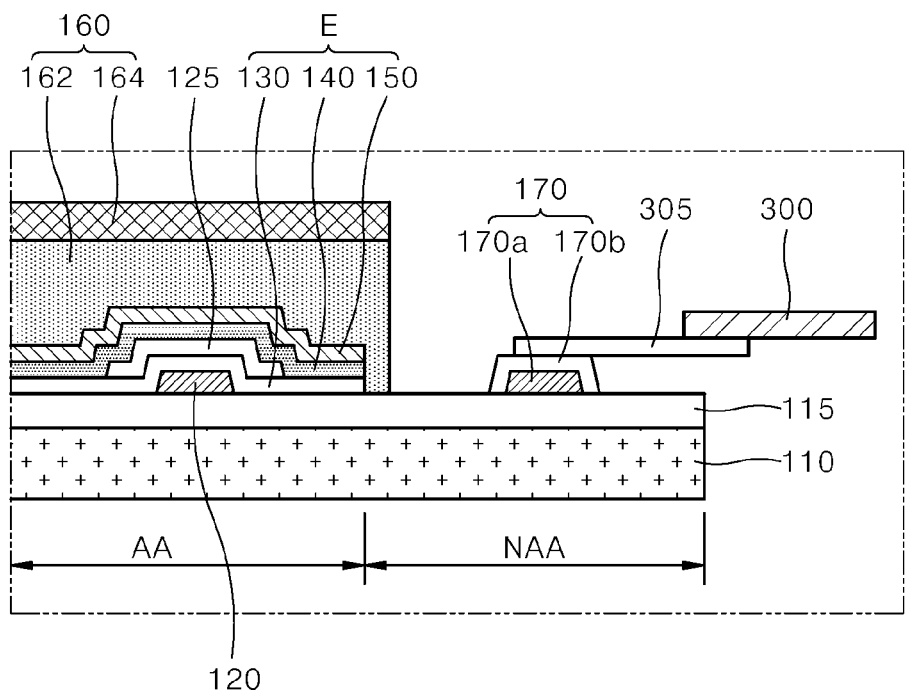
FIG. 3 is an enlarged cross-sectional view of portion A of FIG. 2.

The first electrode 130, the organic light emitting layer 140, and the second electrode 150 constitute the organic light emitting device E. Here, the first electrode 130 is an anode of the organic light emitting device E and the second electrode 150 is a cathode of the organic light emitting device E. When voltage is applied between the first electrode 130 and the second electrode 150, electrons and holes are injected into the organic light emitting layer 140 from the second electrode 150 and the first electrode 130, respectively, thereby generating excitons in the organic light emitting layer 140. As the excitons decay, light corresponding to energy difference between a lowest unoccupied molecular orbital (LUMO) and a highest occupied molecular orbital (HOMO) of the organic light emitting layer 140 is generated and emitted toward the substrate 110. FIG. 3 is an enlarged cross-sectional view of portion A of FIG. 2.

Referring to FIG. 2 and FIG. 3, an encapsulation layer 160 covering the second electrode 150 of the organic light emitting device E is disposed in the active area AA on the substrate 110 having the organic light emitting device E formed thereon.

The encapsulation layer 160 may include an adhesive layer 162 and a base layer 164 disposed on the adhesive layer 162. In this way, the encapsulation layer 160 including the adhesive layer 162 and the base layer 164 is disposed in the active region AA of the substrate 110 having the organic light emitting device E thereon such that the OLED lighting apparatus 100 can be sealed by the base layer 164 attached to the adhesive layer 162.

Here, the adhesive layer 162 may be formed of a photo-curable adhesive or a heat-curable adhesive. The base layer 164 serves to prevent penetration of moisture or air from the outside and may be formed of any material so long as the material can perform this function. For example, the base layer 164 may be formed of a polymeric material, such as polyethylene terephthalate (PET), or a metallic material, such as an aluminum foil, an Fe—Ni alloy, or an Fe—Ni—Co alloy.

In the first aspect, the encapsulation layer 160 is disposed to only cover the active area AA on the substrate 110 so as to expose the pad 170 disposed in a non-active area NAA such that the pad 170 can be connected to an FPCB substrate 300, whereby a signal coming from the outside through the FPCB substrate 300 can be applied to each of the first electrode 130 and the second electrode 150 via the pad 170.

Accordingly, the organic light emitting device E disposed in the active area AA on the substrate 110 is sealed by the encapsulation layer 160 and the pad 170 disposed in the non-active area NAA on the substrate 110 is exposed to the outside. In this way, the pad 170 exposed to the outside of the encapsulation layer 160 is connected to the FPCB substrate 300 via a COF tape 305.

Here, the FPCB substrate 300 is electrically connected to the pad 170 by tape automated bonding via the COF tape 305. In the first aspect, since the encapsulation layer 160 is not disposed in the non-active region NAA of the substrate 110 in which the pad 170 is disposed, the substrate 110 under the buffer layer 115 serves to stably support the pad 170. Accordingly, the OLED lighting apparatus 100 according to the first aspect necessarily requires the substrate 110, which is formed of a flexible polymeric material.

The OLED lighting apparatus 100 according to the first aspect using the organic light emitting device formed of an organic luminescent material has relatively good luminous efficacy in the green and red wavelength regions, as compared with a lighting apparatus using an inorganic light emitting device, and exhibits improved color rendering properties due to relatively wide emission peak in the blue, red, and green wavelength regions, thereby emitting light similar to sunlight.

However, for the OLED lighting apparatus 100 according to the first aspect, the substrate 110 is formed of a transparent, soft and flexible polymeric material, such as plastic materials, to provide flexibility to the OLED lighting apparatus.

Accordingly, the OLED lighting apparatus 100 according to the first aspect is fabricated on a carrier glass 10 as shown in FIG. 2, followed by separation of the substrate 110, that is, the OLED lighting apparatus 100, from the carrier glass 10 through irradiation with laser beams. Here, a sacrificial layer 5 formed of silicone is disposed between the carrier glass 10 and the substrate 110 to facilitate separation of the substrate through irradiation with laser beams.

For the OLED lighting apparatus 100 according to the first aspect, among flexible polymeric materials, a polyimide (PI) film having good heat resistance is used as a material for the substrate 110. However, such a PI film is much more expensive than other polymeric materials, causing increase in manufacturing cost.

Further, since the PI film is likely to be damaged at a high temperature exceeding 350° C., exceeding a heat-resistant temperature of PI, a method of forming the auxiliary wires 120, the organic light emitting device E and the like is performed under limited conditions, that is, at a temperature below 350° C., thereby causing deterioration in reliability of the organic light emitting device E.

In order to solve such a problem, an OLED lighting apparatus according to a second aspect omits a substrate and instead includes: an encapsulation layer disposed over the entire region of a buffer layer including an active area and a non-active area; and a via electrode passing through the encapsulation layer to be electrically connected to a pad, thereby improving reliability of an organic light emitting device while reducing manufacturing costs.

Next, an OLED lighting apparatus according to a second aspect of the present disclosure will be described with reference to the accompanying drawings.

Figure 4:
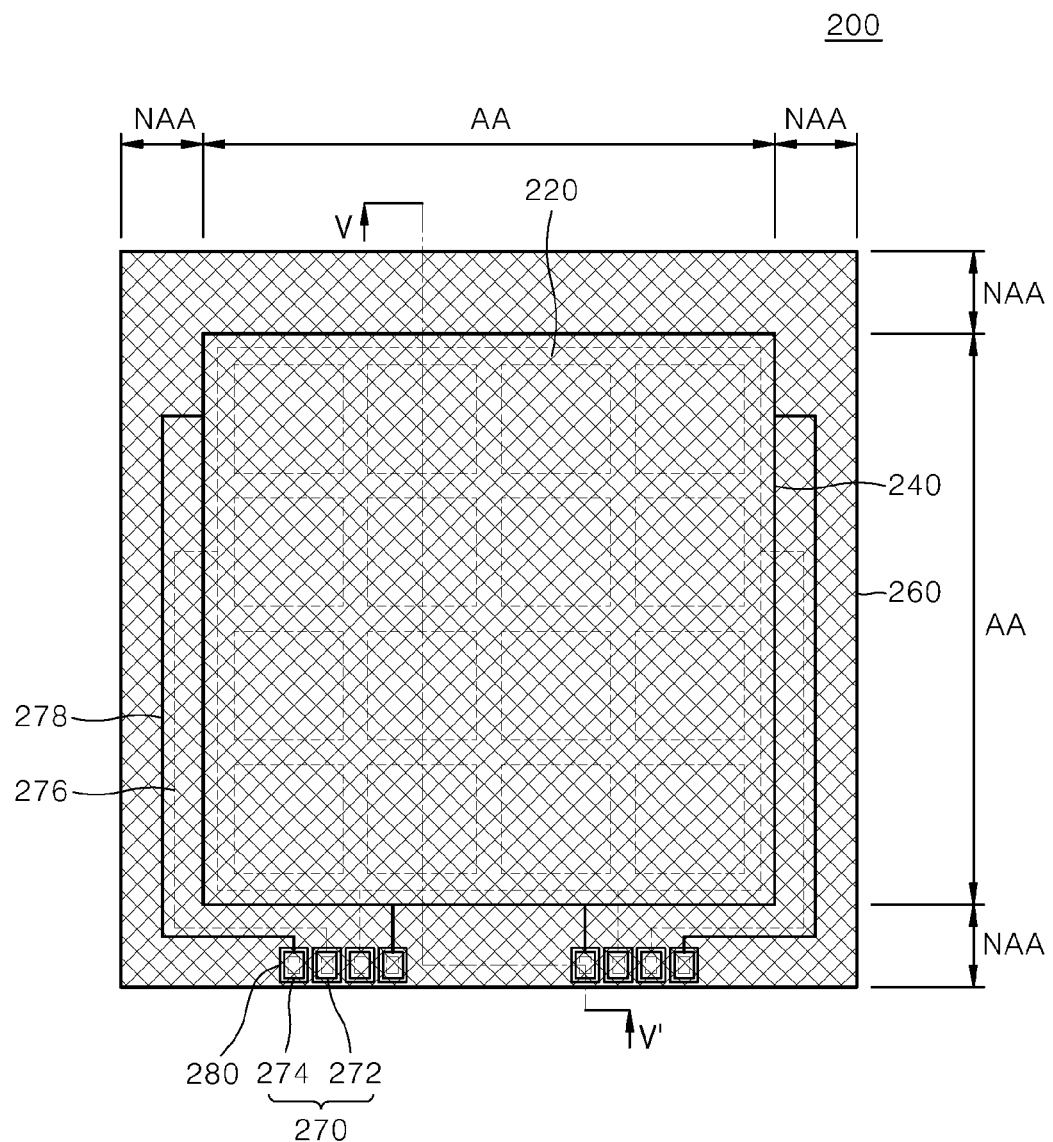
FIG. 4 is a plan view of an OLED lighting apparatus according to a second aspect of the present disclosure.
Figure 5:
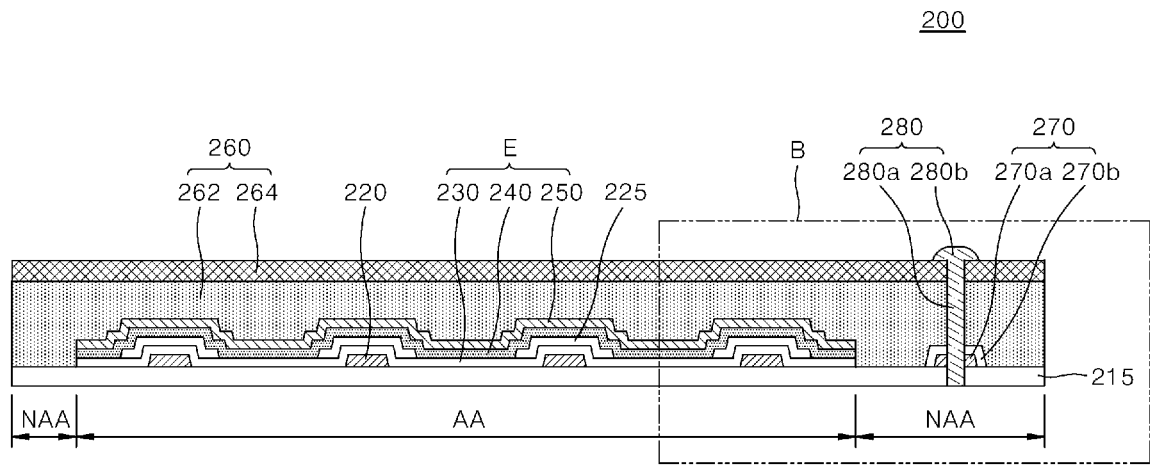
FIG. 5 is a cross-sectional view taken along line V-V' of FIG. 4.

FIG. 4 is a plan view of an OLED lighting apparatus according to a second aspect of the present disclosure, which can achieve both improvement in reliability and reduction in manufacturing costs, and FIG. 5 is a cross-sectional view taken along line V-V' of FIG. 4.

Referring to FIG. 4 and FIG. 5, an OLED lighting apparatus 200 according to the second aspect includes: a buffer layer 215; auxiliary wires 220; an organic light emitting device E; a pad 270; an encapsulation layer 260; and a via electrode 280.

The buffer layer 215 has an active region AA and a non-active region NAA. The buffer layer 215 serves to block penetration of moisture or air from below. For this purpose, the buffer layer 215 may be formed of an inorganic material, such as $SiO_x$ or $SiN_x$. Particularly, the OLED lighting apparatus 200 according to the second aspect omits a substrate which would otherwise be disposed under the buffer layer 215, thereby allowing a method of forming the auxiliary wires 220, the organic light emitting device E and the like to be performed at a high temperature exceeding 350° C., thereby improving reliability of the organic light emitting device E while reducing manufacturing costs. Further, since the buffer layer 215 formed of an inorganic material, such as $SiO_x$ or $SiN_x$, is exposed to a high temperature exceeding 350° C., the buffer layer can exhibit improved properties in terms of strength and hardness.

The auxiliary wires 220 are disposed in the active area AA on the buffer layer 215. The auxiliary wires 120 may be arranged in the form of a matrix, mesh, hexagon, octagon, or circle having a small linewidth over the active area AA of the buffer layer 215 to allow uniform voltage to be applied to the first electrode 230, whereby the OLED lighting apparatus 200 can emit light with uniform luminance when implemented as a large lighting apparatus.

Although the auxiliary wires 220 are shown as disposed beneath a lower surface of the first electrode 230, it should be understood that the present disclosure is not limited thereto and the auxiliary wires 220 may be disposed on an upper surface of the first electrode 230. The auxiliary wires 120 may be formed of any one selected from Al, Au, Cu, Ti, W, Mo, Cr, and alloys thereof. The auxiliary wires 220 may have a monolayer structure or a multilayer structure.

The buffer layer 215 may be divided into a plurality of unit pixels by the auxiliary wires 220 arranged in matrix form. Since the auxiliary wires 220 have a very low resistance, as compared with the first electrode 230, voltage for the first electrode 230 is applied to the first electrode 230 through the auxiliary wires 220 rather than being applied directly to the first electrode 230 via a first pad 272. Thus, the first electrode 230 formed over the entire buffer layer 215 can be divided into a plurality of pixels by the auxiliary wires 220.

The auxiliary wires 220 may have a linewidth of about 30 μm to about 70 μm, although the linewidth of the auxiliary wires can vary depending on the kind of metal used as a material for the auxiliary wires, the area of the OLED lighting apparatus 200, the size of the pixel, and the like.

The organic light emitting device E is disposed on the auxiliary wires 220. The organic light emitting device E includes a first electrode 230 disposed on the auxiliary wires 220 to be directly connected to the auxiliary wires 220, an organic light emitting layer 240 disposed on the first electrode 230, and a second electrode 250 disposed on the organic light emitting layer 240.

The organic light emitting layer 240 may be formed of an organic luminescent material that emits white light. For example, the organic light emitting layer 240 may be composed of a blue organic light emitting layer, a red organic light emitting layer, and a green organic light emitting layer. Alternatively, the organic light emitting layer 240 may have a tandem structure including a blue light emitting layer and a yellow-green light emitting layer. However, it should be understood that the present disclosure is not limited thereto and the organic light emitting layer 240 may be configured in various ways.

Although not shown, the organic light emitting device E may further include: an electron injection layer and a hole injection layer that inject electrons and holes into the organic light emitting layer 240, respectively; an electron transport layer and a hole transport layer that transport the injected electrons and holes to the organic light emitting layer; and a charge generation layer that generates charges such as electrons and holes.

The organic light emitting layer 240 may be formed of a material that receives holes and electrons from the hole transport layer and the electron transport layer, respectively, to emit light in the visible region through recombination of the holes and the electrons. Particularly, a material having good quantum efficiency for fluorescence or phosphorescence may be used. Examples of the material may include an 8-hydroxyquinoline aluminum complex ($Alq_3$), a carbazole compound, a dimerized styryl compound, BAlq, a 10-hydroxybenzoquinoline-metal compound, benzoxazole, benzthiazole, and benzimidazole compounds, and poly(p-phenylenevinylene) (PPV), without being limited thereto.

In addition, the OLED lighting apparatus 200 according to the second aspect may further include a protective layer 225 disposed between the first electrode 230 and the organic light emitting layer 240 to cover the auxiliary wires 220. The protective layer 225 may be formed on the first electrode 230 to surround the auxiliary wires 220, thereby reducing level difference caused by the auxiliary wires 220. As a result, the organic light emitting layer 240 and the second electrode 250 can be stably stacked on the protective layer 225 without disconnection.

For this purpose, the protective layer 225 may be formed as an inorganic layer such as $SiO_x$ or $SiN_x$. Alternatively, the protective layer 225 may be formed as an organic layer such as photoacryl, or may be formed as a plurality of layers including an inorganic layer and an organic layer.

The pad 270 is connected to the first electrode 230 and the second electrode 250 and disposed in a non-active area NAA. That is, the pad 270 is electrically connected to the first electrode 230 and the second electrode 250 and receives voltage from the outside. For this purpose, the pad 270 may include a first pad 272 connected to the first electrode 230 and a second pad 274 connected to the second electrode 250. The first pad 272 and the second pad 274 may be electrically connected to the first electrode 230 and the second electrode 250 through a first connection wire 276 and the second connection wire 278, respectively.

Although the pad 270 is shown as disposed at one side of the buffer layer 215 in FIG. 4, it should be understood that the present disclosure is not limited thereto and the location and number of the pad 270 may be varied. For example, the pad 270 may be disposed at two opposite sides of the buffer layer 215 or may be disposed at four sides of the buffer layer 215. For example, the first pad 272 and the second pad 274 may be disposed at two opposite sides of the buffer layer 215 or may be disposed at four sides of the buffer layer 215.

Here, the pad 270 may include a pad electrode 270a disposed on the same layer as the auxiliary wires 220 and formed of the same material as the auxiliary wires 220 and a pad electrode terminal 270b disposed on the pad electrode 270a and formed of the same material as the first electrode 230. Here, the pad electrode terminal 270b is disposed on upper and side surfaces of the pad electrode 270a to surround the upper and side surfaces of the pad electrode 270a.

In the second aspect, the encapsulation layer 260 is disposed over an active area AA and a non-active area NAA on the buffer layer 215 to cover the second electrode 250 and the pad 270. That is, the encapsulation layer 260 may have the same area as the buffer layer 215 to cover all of the active area AA and the non-active area NAA of the buffer layer 215 having the pad 270 and the organic light emitting device E formed thereon.

In this way, the encapsulation layer 260 is disposed over the active area AA and the non-active area NAA of the buffer layer 215, whereby the pad 270 disposed in the non-active area NAA of the buffer layer 215 can be stably secured by the encapsulation layer 260 bonded thereto. Accordingly, the OLED lighting apparatus according to the second aspect can omit a substrate which would otherwise be disposed under the buffer layer 215.

The encapsulation layer 260 may include an adhesive layer 262 and a base layer 264 disposed on the adhesive layer 262. In this way, the encapsulation layer 260 including the adhesive layer 262 and the base layer 264 is disposed in the active area AA of the buffer layer 215 having the organic light emitting device E formed thereon, such that the OLED lighting apparatus 200 can be sealed by the base layer 264 attached via the adhesive layer 262.

Here, the adhesive layer 262 may be formed of a photo-curable adhesive or a heat-curable adhesive. The base layer 264 serves to prevent penetration of moisture or air from the outside and may be formed of any suitable material for performing this function. For example, the base layer 264 may be formed of a polymeric material such as polyethylene terephthalate (PET) or a metallic material such as an aluminum foil, an Fe—Ni alloy, or an Fe—Ni—Co alloy.

The via electrode 280 passes through the encapsulation layer 260 in the non-active area NAA to be connected to the pad 270.

The via electrode 280 includes a penetration portion 280a and a connection terminal 280b.

The penetration portion 280a of the via electrode 280 is disposed to pass through the encapsulation layer 260, the pad 270, and the buffer layer 215 in the non-active area NAA to be electrically connected to the pad 270. Thus, the penetration portion 280a of the via electrode 280 is electrically connected to the pad 270 at the center of the pad 270 in a lateral-contact geometry.

The connection terminal 280b of the via electrode 280 is disposed on an upper surface of the encapsulation layer 260 in the non-active area NAA to be connected to the penetration portion 280a of the via electrode 280. Accordingly, the connection terminal 280b of the via electrode 280 is disposed on the upper surface of the encapsulation layer 260 to be exposed to the outside.

The via electrode 280 may be formed of a metallic material having good electrical conductivity. For example, the via electrode 280 may be formed of at least one metal paste selected from among Ag, Al, Cu, and Au.

Figure 6:
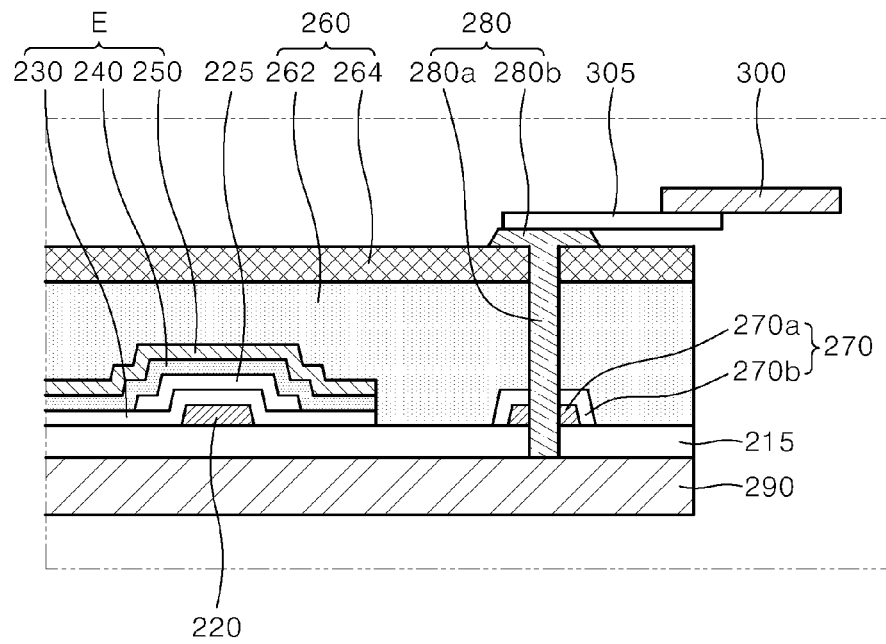
FIG. 6 is an enlarged sectional view of portion B of FIG. 5.

FIG. 6 is an enlarged sectional view of portion B of FIG. 5, which will be described in conjunction with FIG. 5.

Referring to FIG. 5 and FIG. 6, the OLED lighting apparatus 200 according to the second aspect may further include a protective film 290 disposed under the buffer layer 215 to protect the buffer layer 215. The protective film 290 disposed under the buffer layer 215 may not be necessarily provided and may be omitted if necessary.

Since the protective film 290 is attached to a lower surface of the buffer layer 215 after formation of the organic light emitting device E, there is no need to expose the protective film 290 to a high-temperature process. Thus, the protective film 290 does not need to be formed of an expensive PI film.

For example, the protective film 290 may be formed of one of polyethylene terephthalate (PET), polymethylmethacrylate (PMMA), polyethylene terephthalate (PEN), polyester (PE), polycarbonate (PC), and polyethersulfone (PES).

Particularly, in the OLED lighting apparatus 200 according to the second aspect, the encapsulation layer 260 is disposed over the active area AA and the non-active area NAA on the buffer layer 215 and the via electrode 280 passes through the encapsulation layer 260 in the non-active area NAA to be electrically connected to the pad 270.

In the first aspect, since the encapsulation layer 160 is not disposed in the non-active area NAA of the substrate 110, in which the pad 170 is disposed, as shown in FIG. 3, the substrate 110 is necessarily required to stably support the pad 170.

In the second aspect, since the encapsulation layer 260 is disposed over the active area AA and the non-active area NAA on the buffer layer 215, as shown in FIG. 5 and FIG. 6, the pad 270 disposed in the non-active area NAA of the buffer layer 215 can be stably secured by the encapsulation layer 260 bonded thereto.

Accordingly, upon tape automated bonding between an FPCB substrate 300 with a COF tape 305 attached thereto and the via electrode 280, the COF tape 305 does not directly contact the pad 270 but contacts the via electrode 280 connected to the pad 270, particularly the connection terminal 280b of the via electrode 280 on the encapsulation layer 260, thereby establishing electrical connection between the FPCB substrate 300 and the via electrode 270. Here, electrical connection between the via electrode 280 and the FPCB substrate 300 may be achieved by tape automated bonding between the connection terminal 280b of the via electrode 280 and the COF tape 305. In this way, the connection terminal 280b of the via electrode 280 is electrically connected to the FPCB substrate 300 via the COF tape 305, whereby a signal from the outside can be applied to the pad 270 connected to the via electrode 280.

Since tape automated bonding can be performed after the pad 270 disposed in the non-active area NAA of the buffer layer 215 is stably secured by the encapsulation layer 260, it is possible to omit a substrate formed of an expensive transparent PI film, which would be otherwise disposed under the buffer layer 215, thereby reducing manufacturing costs.

In addition, since such a substrate can be omitted, a method of forming the auxiliary wires 220, the organic light emitting device E and the like can be performed at a high temperature exceeding 350° C., thereby improving reliability of the organic light emitting device E. Further, since the buffer layer 215 formed as an inorganic layer such as $SiO_x$ or $SiN_x$ is exposed to a high temperature exceeding 350° C., the buffer layer can exhibit improved properties in terms of strength and hardness.

Next, a method of manufacturing the OLED lighting apparatus according to the second aspect of the present disclosure will be described with reference to the accompanying drawings. FIG. 7 to FIG. 11 are cross-sectional views illustrating a method of manufacturing the OLED lighting apparatus according to the second aspect of the present disclosure.

Figure 7:
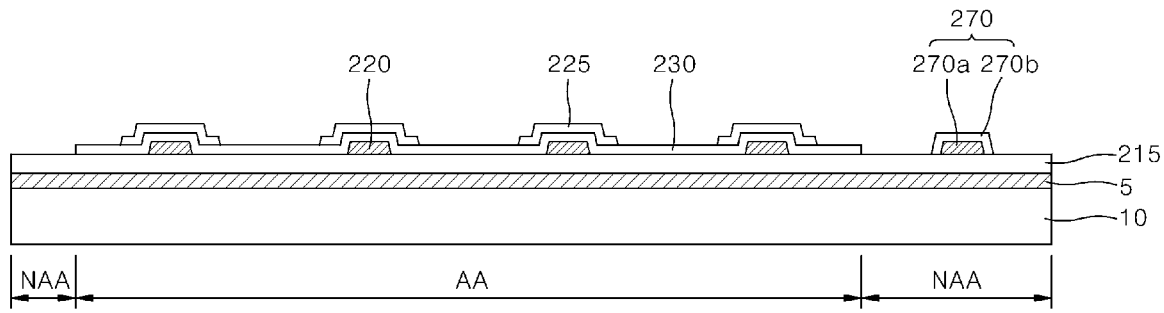
FIG. 7 to FIG. 11 are cross-sectional views illustrating a method of manufacturing the OLED lighting apparatus according to a second aspect of the present disclosure.

Referring to FIG. 7, a buffer layer 215 is formed on a carrier substrate 10 having a sacrificial layer 5. When an inorganic material such as $SiO_x$ or $SiN_x$ is used for the buffer layer 215, the buffer layer 215 may be formed by sputtering, and, when an organic material such as photoacryl is used for the buffer layer, the buffer layer 215 may be formed by spin coating.

Next, auxiliary wires 220 are formed in an active area AA on the buffer layer 215. The auxiliary wires 220 are arranged in the form of a matrix, mesh, hexagon, octagon, circle or the like having a small linewidth over the entire active area AA of the buffer layer 215 to allow uniform voltage to be applied to a first electrode 230, which will be subsequently fabricated, such that a large area OLED lighting apparatus can emit light with uniform luminance.

For this purpose, the auxiliary wires 220 may be formed of one of Al, Au, Cu, Ti, W, Mo, Cr, and alloys thereof. The auxiliary wires 220 may have a monolayer structure or a multilayer structure.

Next, the first electrode 230 is formed on the auxiliary wires 220, followed by forming a protective layer 225 on the first electrode 230. Here, the first electrode 230 may be disposed over the entire active area AA. The first electrode 230 may be formed of a transparent conductive material such as ITO. The protective layer 225 may be formed on the first electrode 230 to surround the auxiliary wires 220, thereby reducing surface roughness caused by the auxiliary wires 220. The protective layer 225 may be formed as an inorganic layer, such as $SiO_x$ or $SiN_x$. Alternatively, the protective layer 225 may be formed as an organic layer such as photoacryl, or may be formed as a plurality of layers including an inorganic layer and an organic layer.

Figure 8:
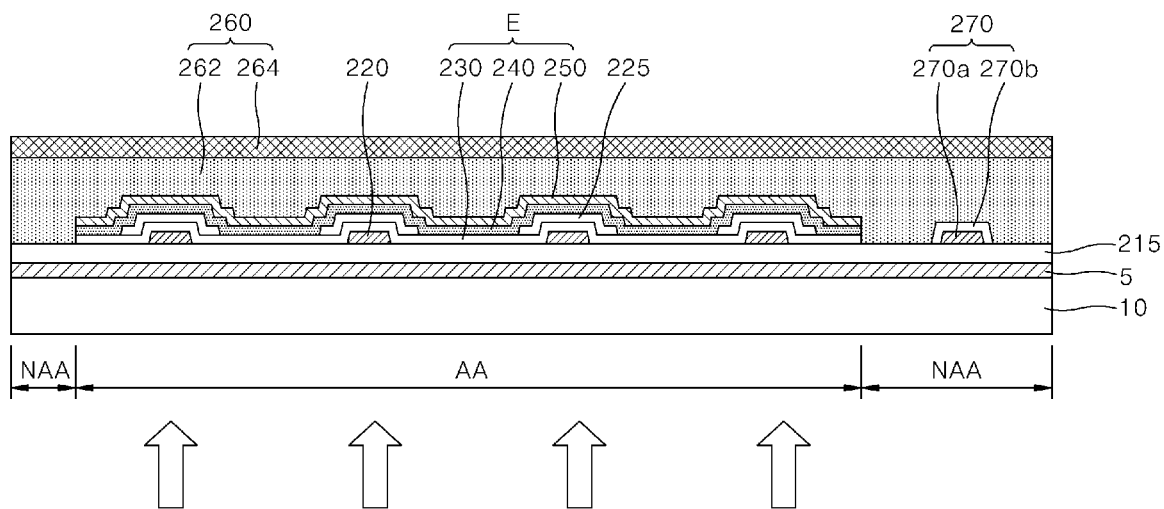

Referring to FIG. 8, an organic light emitting layer 240 is formed on the protective layer 225 and the first electrode 230, followed by formation of a second electrode 250 on the organic light emitting layer 240. Here, the organic light emitting layer 240 may be formed by vapor deposition and the second electrode 250 may be formed by sputtering, without being limited thereto.

Next, an encapsulation layer 260 is formed over the active area AA and the non-active area NAA on the buffer layer 215 having the second electrode 250 formed thereon. Here, the encapsulation layer 260 may be attached to the buffer layer 215 having the organic light emitting device E formed thereon by thermal compression bonding.

The encapsulation layer 260 may include an adhesive layer 262 and a base layer 264 disposed on the adhesive layer 262. In this way, the encapsulation layer 260 including the adhesive layer 262 and the base layer 264 is disposed in the active region AA of the buffer layer 215 in which the organic light emitting device E is disposed, such that the OLED lighting apparatus can be sealed by the base layer 264 attached via the adhesive layer 262.

Here, the adhesive layer 262 may be formed of a photocurable adhesive or a heat-curable adhesive. The base layer 264 serves to prevent penetration of moisture or air from the outside and may be formed of any suitable material for performing this function. For example, the base layer 264 may be formed of a polymeric material such as polyethylene terephthalate (PET) or a metallic material such as an aluminum foil, an Fe—Ni alloy, or an Fe—Ni—Co alloy.

As described above, in the second aspect, the encapsulation layer 260 is disposed over the active area AA and the non-active area NAA, whereby the buffer layer 215 in the non-active area NAA can also be stably attached. Accordingly, it is possible to omit a substrate which would otherwise be disposed under the buffer layer 215.

Next, the carrier substrate 10 having the sacrificial layer 5 is removed from the buffer layer 215 through irradiation with laser beams from below the carrier substrate 10 having the sacrificial layer 5.

Figure 9:
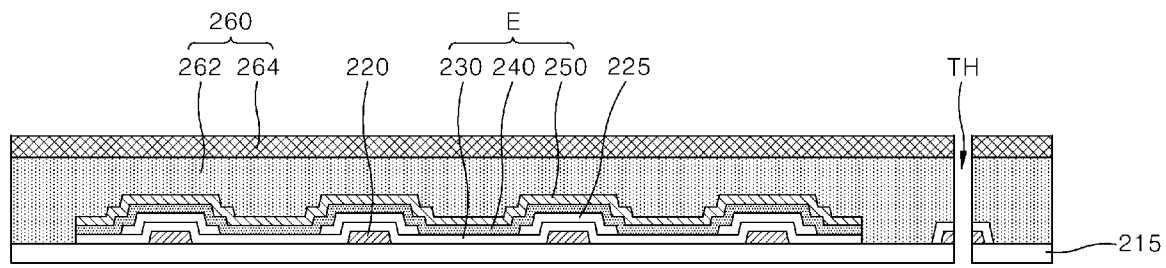

Referring to FIG. 9, a through-hole TH is formed through the encapsulation layer 260, the pad 270 and the buffer layer 215 in the non-active area NAA. The through-hole TH may be formed by micro-punching from the upper surface of the encapsulation layer 260 to the buffer layer 215.

Although the through-hole TH may be formed through a central portion of the pad 270, it should be understood that the through-hole may also be formed through an edge of the pad 270. Formation of the through-hole TH allows a central inner surface of the pad 270 to be exposed to the outside.

Figure 10:
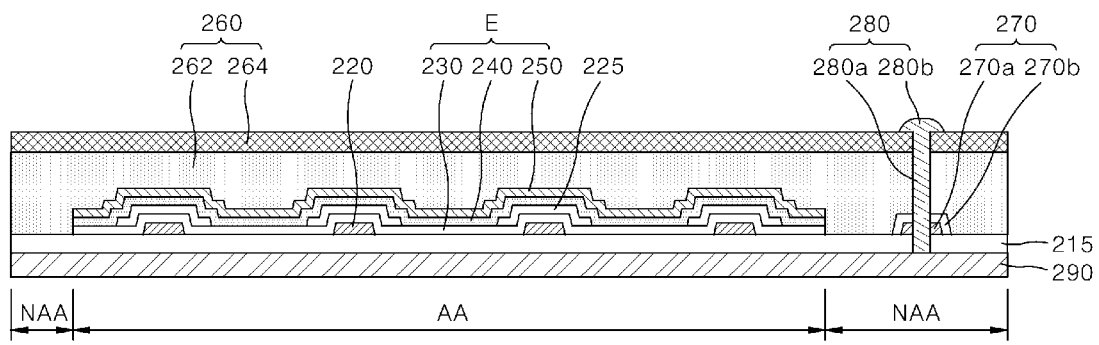

Referring to FIG. 10, a protective film 290 is attached to a lower surface of the buffer layer 215 having the through-hole (TH in FIG. 9) formed therethrough. Here, the protective film 290 disposed under the buffer layer 215 is not necessarily formed and may be omitted if necessary.

Since the protective film 290 is attached to the lower surface of the buffer layer 215 after formation of the organic light emitting device E, there is no need to expose the protective film 290 to a high-temperature process. Thus, the protective film 290 does not need to be formed of an expensive PI film.

For example, the protective film 290 may be formed of one of polyethylene terephthalate (PET), polymethylmethacrylate (PMMA), polyethylene terephthalate (PEN), polyester (PE), polycarbonate (PC), and polyethersulfone (PES).

Next, the through-hole is filled with a metal paste having good electrical conductivity, followed by curing the metal paste to form a via electrode 280. The metal paste may include at least one selected from among of Ag, Al, Cu, and Au.

The via electrode 280 passes through the encapsulation layer 260 in the non-active area NAA to be connected to the pad 270.

Here, the via electrode 280 includes a penetration portion 280a and a connection terminal 280b.

The penetration portion 280a of the via electrode 280 is disposed to pass through the encapsulation layer 260, the pad 270, and the buffer layer 215 in the non-active area NAA to be electrically connected to the pad 270. Thus, the penetration portion 280a of the via electrode 280 is electrically connected to the pad 270 at the center of the pad 270 in a lateral-contact geometry.

The connection terminal 280b of the via electrode 280 is disposed on an upper surface of the encapsulation layer 260 in the non-active area NAA to be connected to the penetration portion 280a of the via electrode 280. Accordingly, the connection terminal 280b of the via electrode 280 is disposed on the upper surface of the encapsulation layer 260 to be exposed to the outside.

Figure 11:
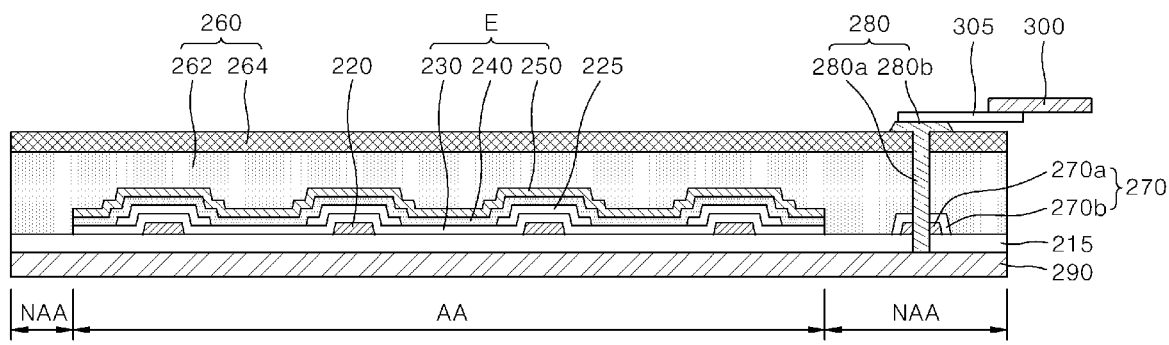

Referring to FIG. 11, the via electrode 280 is connected to an FPCB substrate 300. As a result, an external signal from the FPCB substrate 300 can be applied to the pad 270 through the via electrode 280.

Here, electrical connection between the via electrode 280 and the FPCB substrate 300 may be achieved by tape automated bonding between the COF tape 305 and the connection terminal 280b of the via electrode 280. In this way, the connection terminal 280b of the via electrode 208 is electrically connected to the FPCB substrate 300 via the COF tape 305, such that a signal from the outside can be applied to the pad 270 connected to the via electrode 280.

Although some aspects have been described herein, it should be understood by those skilled in the art that these aspects are given by way of illustration only and the present disclosure is not limited thereto. In addition, it should be understood that various modifications, variations, and alterations can be made by those skilled in the art without departing from the spirit and scope of the present disclosure.

<List of Reference Numerals>

| | |
|---|---|
| 200: OLED lighting apparatus | 215: buffer layer |
| 220: auxiliary wires | 225: protective layer |
| 230: first electrode | 240: organic light emitting layer |
| 250: second electrode | 260: encapsulation layer |
| 262: adhesive layer | 264: base layer |
| 270: pad | 270a: pad electrode |
| 270b: pad electrode terminal | 280: via electrode |
| 280a: penetration portion of via electrode | |
| 280b: connection terminal of via electrode | |
| E: organic light emitting device | AA: active area |
| NAA: non-active area | |

What is claimed is:

1. An OLED lighting apparatus having an active area and a non-active area, comprising:
    a buffer layer;
    an auxiliary wire disposed on the buffer layer;
    an organic light emitting device including a first electrode disposed on the auxiliary wire and connected to the auxiliary wire and a second electrode stacked on the first electrode, and an organic light emitting layer between the first and second electrodes;
    a pad connected to the first electrode and the second electrode and disposed in the non-active area; and
    an encapsulation layer disposed over the buffer layer to cover the second electrode and the pad.

2. The OLED lighting apparatus according to claim 1, further comprising a via electrode passing through the encapsulation layer in the non-active area and connected to the pad.

3. The OLED lighting apparatus according to claim 1, wherein the pad is disposed on at least one side of the buffer layer.

4. The OLED lighting apparatus according to claim 1, wherein the pad includes:
    a pad electrode disposed at a same layer as the auxiliary wire and formed of a same material as the auxiliary wire; and
    a pad electrode terminal disposed on the pad electrode and formed of a same material as the first electrode.

5. The OLED lighting apparatus according to claim 4, wherein the pad electrode terminal is disposed on upper and side surfaces of the pad electrode and surrounds the upper and side surfaces of the pad electrode.

6. The OLED lighting apparatus according to claim 1, wherein the encapsulation layer covers both the active area and the non-active area.

7. The OLED lighting apparatus according to claim 1, wherein the via electrode includes:
    a penetration portion passing through the encapsulation layer, the pad, and the buffer layer in the non-active area, and connected to the pad; and a connection terminal disposed on an upper surface of the encapsulation layer in the non-active area, and connected to the penetration portion.

8. The OLED lighting apparatus according to claim 7, wherein the via electrode is connected to a driving circuit through a connection terminal.

9. The OLED lighting apparatus according to claim 1, further comprising a protective layer disposed between the first electrode and the organic light emitting layer and covering the auxiliary wire.

10. The OLED lighting apparatus according to claim 9, further comprising a protective film disposed under the buffer layer and protecting the buffer layer.

11. The OLED lighting apparatus according to claim 9, wherein the protective layer is covers the auxiliary wire and reduces a step coverage caused by the auxiliary wire.

12. The OLED lighting apparatus according to claim 9, wherein the protective layer is covers the auxiliary wire and reduces a step coverage caused by the auxiliary wire.

13. The OLED lighting apparatus according to claim 1, wherein the organic light emitting layer has a tandem structure.

14. An OLED lighting apparatus having an active area and a non-active area, comprising:
  a buffer layer;
  an auxiliary wire disposed on the buffer layer;
  an organic light emitting device including a first electrode disposed on the auxiliary wire and connected to the auxiliary wire, a second electrode stacked on the first electrode and an organic light emitting layer disposed between the first and second electrodes;
  an encapsulation layer disposed over the buffer layer and having an opening;
  a pad connected to the first and second electrodes and disposed in the non-active area and contacting a side of the buffer layer; and
  a via electrode passing through the opening of the encapsulation layer in the non-active area and connected to the pad.

15. The OLED lighting apparatus according to claim 14, wherein the via electrode includes:
  a penetration portion passing through the encapsulation layer, the pad, and the buffer layer in the non-active area, and connected to the pad; and
  a connection terminal disposed on an upper surface of the encapsulation layer in the non-active area, and connected to the penetration portion.

16. The OLED lighting apparatus according to claim 14, further comprising a protective layer disposed between the first electrode and the organic light emitting layer.

17. The OLED lighting apparatus according to claim 16, further comprising a protective film disposed under the buffer layer and protecting the buffer layer.

* * * * *